United States Patent
Dasgupta et al.

(10) Patent No.: US 10,453,679 B2
(45) Date of Patent: Oct. 22, 2019

(54) METHODS AND DEVICES INTEGRATING III-N TRANSISTOR CIRCUITRY WITH SI TRANSISTOR CIRCUITRY

(71) Applicant: Intel Corporation, Santa Clara, CA (US)

(72) Inventors: Sansaptak Dasgupta, Hillsboro, OR (US); Marko Radosavljevic, Beaverton, OR (US); Han Wui Then, Portland, OR (US); Ravi Pillarisetty, Portland, OR (US); Kimin Jun, Hillsboro, OR (US); Patrick Morrow, Portland, OR (US); Valluri R. Rao, Saratoga, CA (US); Paul B. Fischer, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/748,619

(22) PCT Filed: Aug. 28, 2015

(86) PCT No.: PCT/US2015/047462
§ 371 (c)(1),
(2) Date: Jan. 29, 2018

(87) PCT Pub. No.: WO2017/039587
PCT Pub. Date: Mar. 9, 2017

(65) Prior Publication Data
US 2019/0006171 A1  Jan. 3, 2019

(51) Int. Cl.
*H01L 25/16* (2006.01)
*H01L 21/02* (2006.01)
(Continued)

(52) U.S. Cl.
CPC ...... *H01L 21/0254* (2013.01); *H01L 21/0245* (2013.01); *H01L 21/02381* (2013.01);
(Continued)

(58) Field of Classification Search
CPC ....... H01L 21/76251; H01L 21/823475; H01L 25/0657
See application file for complete search history.

(56) References Cited

U.S. PATENT DOCUMENTS

2006/0284247 A1* 12/2006 Augustine ........... H01L 21/8258
257/338
2009/0053864 A1   2/2009  Liu et al.
(Continued)

FOREIGN PATENT DOCUMENTS

WO  2015088674  6/2015

OTHER PUBLICATIONS

International Preliminary Report on Patentability from PCT/US2015/047462 dated Mar. 15, 2018, 10 pgs.
(Continued)

*Primary Examiner* — Thomas L Dickey
(74) *Attorney, Agent, or Firm* — Green, Howard & Mughal LLP

(57) ABSTRACT

Methods and devices integrating circuitry including both III-N (e.g., GaN) transistors and Si-based (e.g., Si or SiGe) transistors. In some monolithic wafer-level integration embodiments, a silicon-on-insulator (SOI) substrate is employed as an epitaxial platform providing a first silicon surface advantageous for seeding an epitaxial III-N semiconductor stack upon which III-N transistors (e.g., III-N HFETs) are formed, and a second silicon surface advantageous for seeding an epitaxial raised silicon upon which Si-based transistors (e.g., Si FETs) are formed. In some heterogeneous wafer-level integration embodiments, an SOI
(Continued)

substrate is employed for a layer transfer of silicon suitable for fabricating the Si-based transistors onto another substrate upon which III-N transistors have been formed. In some such embodiments, the silicon layer transfer is stacked upon a planar interlayer dielectric (ILD) disposed over one or more metallization level interconnecting a plurality of III-N HFETs into HFET circuitry.

16 Claims, 11 Drawing Sheets

(51) Int. Cl.
*H01L 21/762* (2006.01)
*H01L 29/778* (2006.01)
*H01L 27/06* (2006.01)
*H01L 29/20* (2006.01)
*H01L 23/48* (2006.01)
*H01L 21/8258* (2006.01)
*H01L 27/085* (2006.01)
*H01L 21/18* (2006.01)

(52) U.S. Cl.
CPC .. *H01L 21/02433* (2013.01); *H01L 21/02516* (2013.01); *H01L 21/02532* (2013.01); *H01L 21/187* (2013.01); *H01L 21/76251* (2013.01); *H01L 21/8258* (2013.01); *H01L 23/481* (2013.01); *H01L 27/0605* (2013.01); *H01L 27/085* (2013.01); *H01L 29/2003* (2013.01); *H01L 29/7786* (2013.01)

(56) References Cited

U.S. PATENT DOCUMENTS

| | | | |
|---|---|---|---|
| 2010/0117118 A1* | 5/2010 | Dabiran | H01L 29/207 257/190 |
| 2012/0306082 A1* | 12/2012 | Sekar | H01L 23/3677 257/758 |
| 2014/0231870 A1 | 8/2014 | Hoke | |
| 2014/0329370 A1 | 11/2014 | Tipirneni et al. | |

OTHER PUBLICATIONS

International Search Report and Written Opinion from PCT/US2015/047462 dated Feb. 23, 2016, 13 pgs.

* cited by examiner

METHODS AND DEVICES INTEGRATING III-N TRANSISTOR CIRCUITRY WITH SI TRANSISTOR CIRCUITRY

CLAIM OF PRIORITY

This Application is a National Stage Entry of, and claims priority to, PCT Application No. PCT/US2015/047462, filed on 28 Aug. 2015 and titled "METHODS AND DEVICES INTEGRATING III-N TRANSISTOR CIRCUITRY WITH SI TRANSISTOR CIRCUITRY", which is incorporated by reference in its entirety for all purposes.

BACKGROUND

Demand for integrated circuits (ICs) in portable electronic applications has motivated greater levels of semiconductor device integration. Many advanced semiconductor devices in development leverage non-silicon semiconductor materials, a subset of which have wurtzite crystallinity. Exemplary wurtzite materials include AgI, ZnO, CdS, CdSe, α-SiC, BN, GaN, AlN, the last two of which may be grouped together as being in the III-N material system. The III-N material system shows particular promise for high voltage and high frequency applications like power management ICs (PMICs) and RF power amplifiers (PAs). III-N heterostructure field effect transistors (HFETs), such as high electron mobility transistors (HEMT) and metal oxide semiconductor (MOS) HEMT, employ a semiconductor heterostructure with one or more heterojunction. One heterojunction is often at an interface of a GaN semiconductor crystal and another III-N semiconductor alloy, such as AlGaN or AlInN. GaN-based HFET devices benefit from a relatively wide bandgap (~3.4 eV), enabling higher breakdown voltages than Si-based MOSFETs, as well as high carrier mobility. The III-N material system is also useful for photonics (e.g., LEDs), photovoltaics, and sensors, one or more of which may be useful to integrate into an electronic device platform.

Multi-chip integration approaches have been employed to integrate silicon-based devices with those based on wurtzite semiconductor materials. These multi-chip approaches have scaling and performance limitations. Monolithic integration of silicon-based devices (e.g., CMOS field effect transistors) with devices utilizing the wurtzite material system is a challenge due to a large lattice mismatch (e.g., ~41% between GaN and Si) and a large thermal expansion coefficient mismatch (e.g., ~116% between Si and GaN). However, from a commercial standpoint, it is advantageous to integrate III-N transistors into the silicon fabrication infrastructure to take advantage of the economies of scale brought by 300 mm/450 mm wafer processing.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
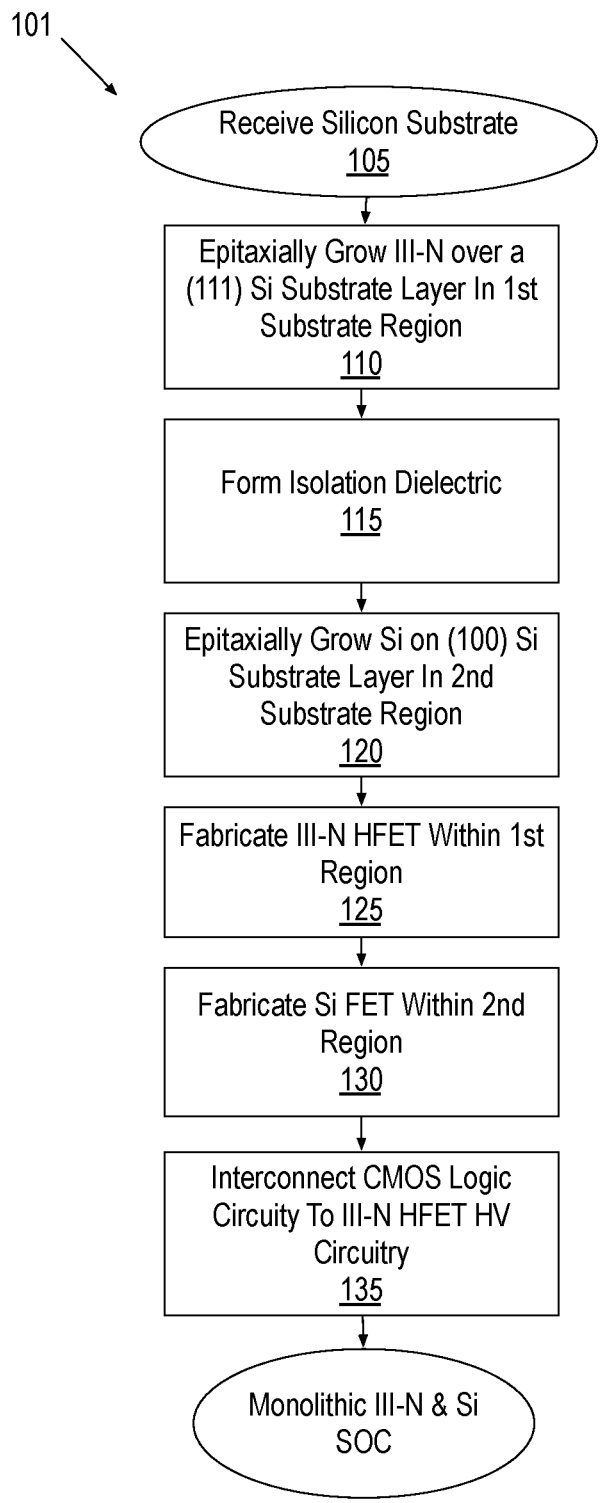
FIG. 1 is a flow diagram illustrating monolithic integration of III-N HFET circuitry and Si FET circuitry, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Described herein are methods and devices integrating circuitry including both III-N (e.g., GaN) transistors and Si-based (e.g., Si or SiGe) transistors at the wafer-level. In some monolithic wafer-level integration embodiments, a silicon-on-insulator (SOI) substrate is employed as an epitaxial platform providing a first silicon surface advantageous for seeding an epitaxial III-N semiconductor stack upon which III-N transistors (e.g., III-N HFETs or other HEMTs) are formed. The SOI substrate further provides a second silicon surface advantageous for seeding an epitaxial raised silicon region upon which Si-based transistors (e.g., Si FETs) are formed. In some heterogeneous wafer-level integration embodiments, an SOI substrate is employed for a layer transfer of silicon suitable for fabricating the Si-based transistors onto another substrate upon which III-N transistors have been formed. In some such embodiments, the silicon layer transfer is stacked upon a planar interlayer dielectric (ILD) disposed over one or more metallization level interconnecting a plurality of III-N HFETs into HFET circuitry. Si-based FETs are then fabricated and interconnected into circuitry coupled to the HFET (or HEMT) circuitry.

FIG. 1 is a flow diagram illustrating monolithic integration of III-N HFET circuitry and Si FET circuitry, in accordance with some embodiments. Although described in the context of advantageous HFET embodiments, it will be appreciated that similar integration may be performed for other III-N based transistor architectures (e.g., any HEMT).

Method 101 begins with receiving a silicon substrate at operation 105. The silicon substrate includes at least two crystalline silicon layers suitable for seeding subsequent epitaxial growths of semiconductor material. As described further below, the layers of crystalline silicon may have different crystal orientations: one orientation advantageous for seeding an epitaxial growth of a crystalline III-N semiconductor stack suitable for HFET fabrication; and another orientation advantageous for seeding an epitaxial growth of crystalline silicon suitable for FET fabrication. The layers of crystalline silicon, being stacked, may also facilitate planarizing separate regions of a wafer surface.

Figure 2A:
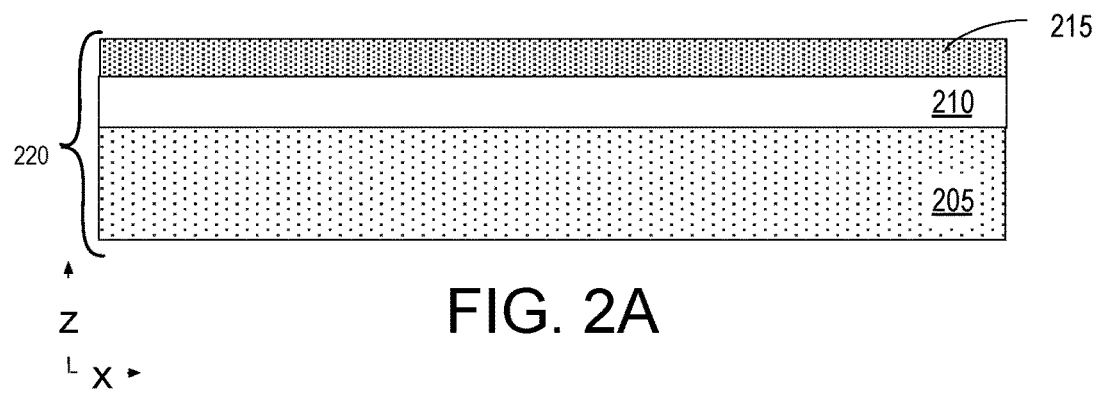
FIG. 2A is a cross-sectional view illustrating a substrate suitable for integration of III-N HFET circuitry and Si FET circuitry, in accordance with some embodiments of the method illustrated in FIG. 1.

FIG. 2A is a cross-sectional view illustrating an SOI substrate 220 suitable for wafer-level monolithic integration of III-N HFET circuitry and Si FET circuitry, in accordance with some embodiments of operation 105 (FIG. 1). SOI substrate 220 includes a first (mono)crystalline silicon substrate layer 215 disposed over a second (mono)crystalline silicon substrate layer 205 with a dielectric layer 210 disposed there between. In some embodiments, dielectric layer 210 is a buried silicon dioxide (BOX) layer. Although only two silicon substrate layers are illustrated, a substrate may include more. For example, a third silicon substrate layer may be present, each of which is insulated from the others by an intervening dielectric layer.

The z-thickness of both silicon substrate layer 215 and dielectric layer 210 may vary with implementation. The z-thicknesses may be targeted, for example, to minimize non-planarity between two regions of substrate 220. For example, z-thickness of silicon substrate layer 215 may be small (e.g., 50-500 nm) to reduce non-planarity between silicon substrate layers 205 and 215. In another example, z-thickness of silicon substrate layer 215 may be large (e.g., 2-4 μm) to match a similar thickness of epitaxial material grown over a region of substrate 220 where layers 210, 215 have been removed. Silicon substrate layer 215 may therefore have a z-thickness ranging from 50 nm to 4 μm, or more. The z-thicknesses may also be targeted based on device performance parameters, such as electrical isolation between circuitry formed in different regions of substrate 220. For example, in a first embodiment where an SOC is to include a high voltage regulator, dielectric layer 210 may be thin (50-200 nm). In a second embodiment where an SOC is to include a high frequency RF power amplifier, dielectric layer 210 is advantageously thick (e.g., 1-2 μm, or more) to provide better noise isolation at high frequencies (e.g., >2 GHZ). Dielectric layer 210 may therefore have a z-thickness ranging from 50 nm to 2 μm, or more.

Crystallographic orientation or silicon substrate layers 205, 215 may each be any of (100), (111), or (110). Other crystallographic orientations are also possible. For example, for a (100) silicon orientation, the surface may be miscut or offcut, for example 2-10° toward [101]. The silicon substrate layer 215 may have a different crystal orientation than silicon substrate layer 205. In some embodiments, a first of silicon substrate layers 205, 215 is (111) silicon, providing a (111) seeding surface advantageous for epitaxially growing materials with hexagonal/wurtzite crystallinity, such as III-N semiconductors. In some further embodiments, a second of silicon substrate layers 205, 215 is (100) silicon, which may be advantageous for fabricating Si-based FETs. In one example illustrated by FIG. 2A, silicon substrate layer 215 has (111) orientation while silicon substrate layer 205 has (100) orientation. In an alternative embodiment however, silicon substrate layer 215 has (100) orientation while silicon substrate layer 205 has (111) orientation.

Returning to FIG. 1, method 101 continues at operation 110 where one or more III-N semiconductor material is epitaxially grown over a first silicon substrate layer within a first region of the substrate. In the exemplary embodiment illustrated in FIG. 1, the III-N semiconductor material is grown over a (111) silicon substrate layer. In some embodiments, the III-N semiconductor material comprises a III-N semiconductor stack, at least one layer of which is a polarization layer of suitable composition to induce a two-degree electron gas (2DEG) within a second III-N layer. The III-N semiconductor stack may further include any known buffer structure and/or intermediate layers.

Figure 2B:
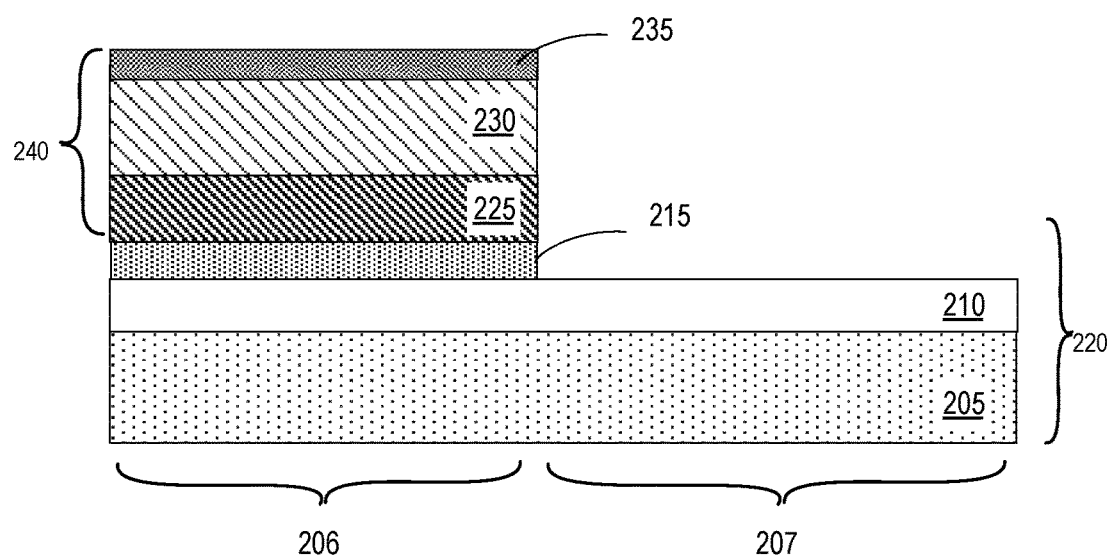
FIG. 2B is a cross-sectional view illustrating a III-N semiconductor stack disposed over a first region of a substrate, formed in accordance with some embodiments of the method illustrated in FIG. 1.

FIG. 2B is a cross-sectional view illustrating a III-N semiconductor stack 240 disposed over a first substrate region 206, formed in accordance with some embodiments of operation 110 (FIG. 1). In this illustrative embodiment, silicon substrate layer 215 is (111) silicon and III-N semiconductor stack 240 is grown directly on a (111) surface of silicon substrate layer 215. The heteroepitaxially growth of III-N material may be confined to substrate region 206 by first patterning SOI substrate 220 and removing silicon substrate layer 215, for example with any known etch process, to expose amorphous dielectric layer 210 within substrate region 207.

Any known III-N heteroepitaxial growth process may be employed at operation 110 to form III-N semiconductor stack 240 over a crystalline seeding surface. III-N semiconductor stack 240 may be formed by chemical vapor deposition (CVD), molecular beam epitaxy (MBE), or any other technique known to be suitable for III-N growth. In exemplary embodiments, III-N semiconductor stack 240 is substantially monocrystalline having the hexagonal/wurzite c-axis substantially orthogonal to the (111) plane of silicon substrate layer 215. In other words, the c-plane of the III-N material is no more than 10° from parallel to the (111) plane of silicon substrate layer 215. In some exemplary embodiments, buffer layer 225 is grown directly on exposed regions of silicon substrate layer 215. While any known buffer structure may be employed, examples include a MN and/or AlGaN layer. Following buffer layer growth, a GaN layer 230 is epitaxially grown using any known technique, growth temperature, pressure, and V/III ratio. Alloy species (e.g., Al) may be incorporated into GaN layer 230. GaN layer 230 may be grown to a z-thickness of 1-4 μm, or more. Following GaN layer growth, a polarization layer 235 is grown, again using any known technique. Because it is disposed on the c-plane (0001) surface of GaN layer 230, polarization layer 235 induces a 2DEG of high charge density and mobility within GaN layer 230 proximate to the interface of polarization layer 235. In some exemplary embodiments, polarization layer 235 includes at least one of an AlGaN and/or AlN and/or AlInN layer. Polarization layer 235 may have a z-thickness of 3-30 nm, for example.

In some embodiments, the III-N heteroepitaxial growth process at operation 110 entails growing III-N heteroepitaxial crystal islands over template openings patterned in an amorphous growth mask (not depicted) disposed over silicon substrate layer 215. For such embodiments, after patterning trenches or windows in the growth mask to expose regions of silicon substrate layer 215, the III-N heteroepitaxial growth process may rely on first epitaxial growth conditions (e.g., a first III-N growth pressure, a first III-N growth temperature, and a first V/III growth precursor ratio), and may further include multiple growth conditions if a nucleation layer is first grown upon interfacial layer. When the template structure is substantially backfilled (i.e., a trench layer planarized), growth conditions may be changed to favor lateral growth of the III-N material over the growth mask material. The amount of lateral overgrowth can be tuned by growth process conditions to achieve a desired ratio of lateral growth rate:vertical growth rate (e.g., 1.5-2.0) to ensure III-N semiconductor stack coalesces into a continuous crystal of sufficient lateral dimensions to support a population of HFETs.

In an alternate embodiment where silicon substrate layer 205 is (111) and silicon substrate layer 215 is (100) silicon, patterning of substrate 220 may entail a blanket amorphous growth mask deposition followed by a patterning of substrate region 207 in which both substrate silicon 215 and dielectric layer 210 are removed to expose silicon substrate layer 205. For such embodiments, the z-thickness of a III-N semiconductor stack (e.g., comparable to stack 240) grown over substrate region 207 is at least partially offset by z-thickness of silicon substrate layer 215 and dielectric layer 210, each of which may be 2 μm or more. For such embodiments, deep silicon and/or dielectric etches may be performed within substrate region 207 while substrate region 206 is masked and the step height depicted in FIG. 2B attributable to a relatively thick III-N epitaxial process may be advantageously reduced, if not completely eliminated.

Returning to FIG. 1, at operation 115 isolation dielectric is formed. The isolation dielectric is to laterally separate the III-N and silicon regions of the substrate and provide electrical isolation between III-N HFETs and Si FETs. The isolation dielectric may be any known dielectric material, such as any material having a conventional relative dielectric constant (e.g., silicon dioxide, silicon nitride, silicon oxynitride, aluminum oxide, etc.), or low relative dielectric constant (e.g., carbon-doped oxide, polymer dielectrics, etc.). Any known technique(s) may be employed to form the isolation dielectric. The isolation dielectric advantageously lands on, or is adjacent to, the substrate dielectric layer so that at least one region of the substrate is lined with electrically insulative dielectric material.

Figure 2C:
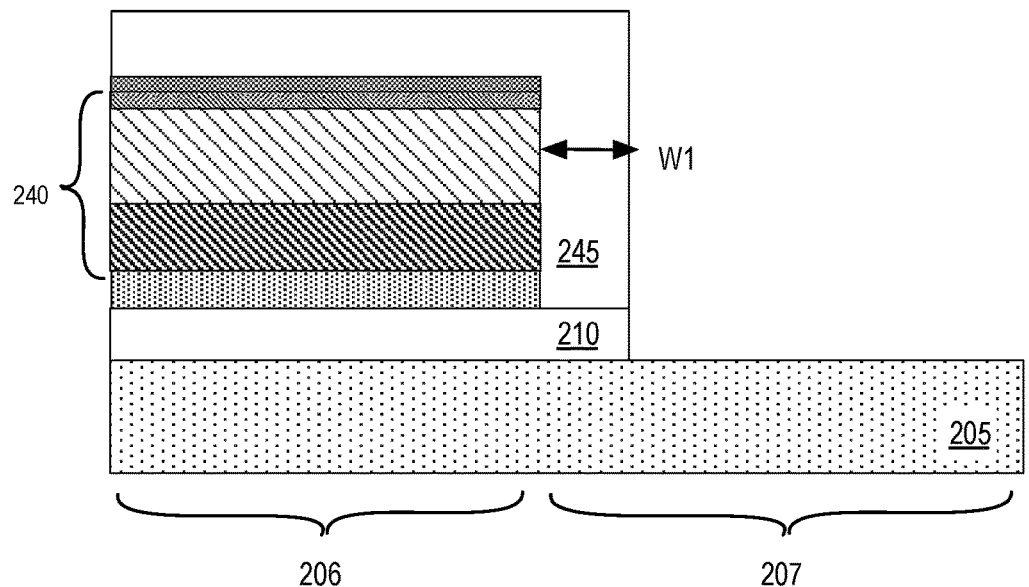
FIG. 2C is a cross-sectional view illustrating an isolation dielectric disposed adjacent to a III-N semiconductor stack, formed in accordance with some embodiments of the method illustrated in FIG. 1.

FIG. 2C is a cross-sectional view illustrating an isolation dielectric 245 disposed adjacent to III-N semiconductor stack 240, formed in accordance with some embodiments of operation 115 (FIG. 1). In the example of FIG. 2C, isolation dielectric 245 is deposited over sidewalls of III-N semiconductor stack 240 to form an electrically insulated perimeter. Isolation dielectric 245 further intersects or is disposed over substrate dielectric layer 210 to form a well of dielectric material surrounding III-N semiconductor stack 240. Isolation dielectric 245 may also be deposited over III-N semiconductor stack 240, as further illustrated. Substrate region 206 is then masked and isolation dielectric 245 removed from substrate region 207 to expose a (100) seeding surface of silicon substrate layer 205. A thickness of isolation dielectric 245 may be selected to achieve a predetermined lateral width W1 sufficient for electrical isolation noise requirements of the application. In some embodiments where III-N material is grown from silicon substrate layer 205 rather than from silicon substrate layer 215, isolation dielectric may instead be formed around the portion of silicon substrate layer 215 retained for Si FETs.

Returning to FIG. 1, at operation 120 raised silicon is epitaxially grown within a second substrate region where Si FET circuitry is to be formed. The raised silicon is advantageously grown on a (100) silicon substrate layer. Operation 115 may be performed as needed to planarize a top surface of the III-N and silicon regions of the substrate, for example to facilitate subsequent device fabrication. Operation 115 may also be performed as needed to arrive at a predetermined impurity doping and/or electrical resistivity suitable for Si FET fabrication. Any known silicon epitaxial growth process may be employed at operation 115. Notably, silicon growth processes are generally at a low growth temperature (e.g., no more than 700-800° C.) and therefore will not be detrimental to the quality of previously grown III-N material.

Figure 2D:
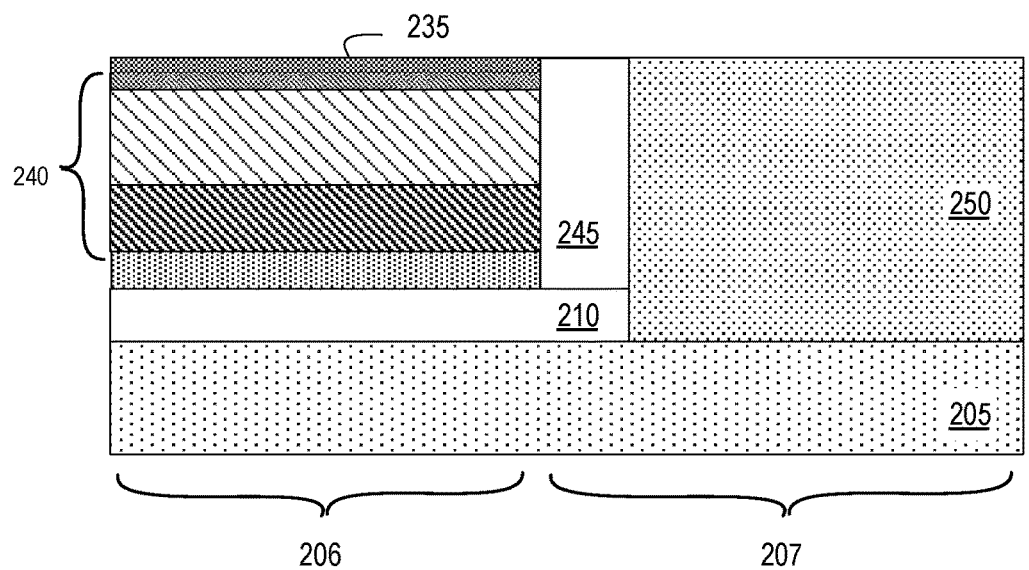
FIG. 2D is a cross-sectional view illustrating a III-N semiconductor stack disposed over a first region of a substrate, and raised silicon disposed over a second region of the substrate, formed in accordance with some embodiments of the method illustrated in FIG. 1.

FIG. 2D is a cross-sectional view illustrating III-N semiconductor stack 240 disposed over a first substrate region 206, and raised silicon 250 disposed over a second substrate region 207, formed in accordance with some embodiments of operation 120. Raised silicon 250 is epitaxially grown from a seeding surface of substrate silicon 205 and may be grown to a thickness sufficient to extend above III-N semiconductor stack 230. Using any conventional epitaxy process, raised silicon 250 may be in-situ impurity doped, for example p-type, and to a desired resistivity. Although silicon is grown within substrate region 207, it is noted that other materials, such as, but not limited to, SiGe, Ge, and III-V materials (e.g., InP, GaAs, GaP, InGaP, AlGaAs, etc.) may be similarly grown using any technique known to be suitable for the chosen material if devices other than Si FETs are desired. Following epitaxial growth within substrate region 207, any conventional planarization process (e.g., CMP) is then employed to planarize a top surface of the epitaxial material within substrate region 207 with that in substrate region 206. In the exemplary embodiment, a top surface of raised silicon 250 is planarized with a top surface of III-N semiconductor stack 240. Planarization exposes III-N polarization layer 235 or an overlying sacrificial layer (not depicted). Following planarization, a top surface of isolation dielectric 245 is also substantially planar with both the top surface of raised silicon 250 and the top surface of III-N polarization layer 235.

In some embodiments where III-N material is grown on silicon substrate layer 205 rather than silicon substrate layer 215, epitaxial growth of raised silicon 250 may be unnecessary in the event that silicon substrate layer 215 is of sufficient thickness to be planar with a top surface of the III-N semiconductor material. In that situation, operation 120 may entail only a planarization operation to arrive at top semiconductor surface similar to that illustrated in FIG. 2D. Otherwise, silicon epitaxy may be employed substantially as above to facilitate planarization.

Method 101 (FIG. 1) continues at operation 125, where III-N transistors are fabricated in the III-N material within the first substrate region. In HFET embodiments, each transistor includes one or more heterojunction, for example between a polarization layer and underlying III-N material forming a 2DEG. Each transistor further includes one or more device terminal coupled to the one or more heterojunction or 2DEG. In some exemplary HFET embodiments, a gate electrode along with a pair of source/drain terminals on opposite sides of the gate electrode are operable as a first transistor based on electric field modulation of the 2DEG. At operation 130, silicon-based transistors are fabricated in silicon material within the second substrate region. In some exemplary FET embodiments, a gate electrode along with a pair of source/drain terminals on opposite sides of the gate electrode are operable as a transistor based on electric field modulation of channel conductivity. With the III-N and silicon substrate regions substantially planar, transistor fabrication processes within each region may be performed concurrently in some advantageous embodiments. Any known transistor fabrication techniques may be employed at operations 125 and 130.

Figure 2E:
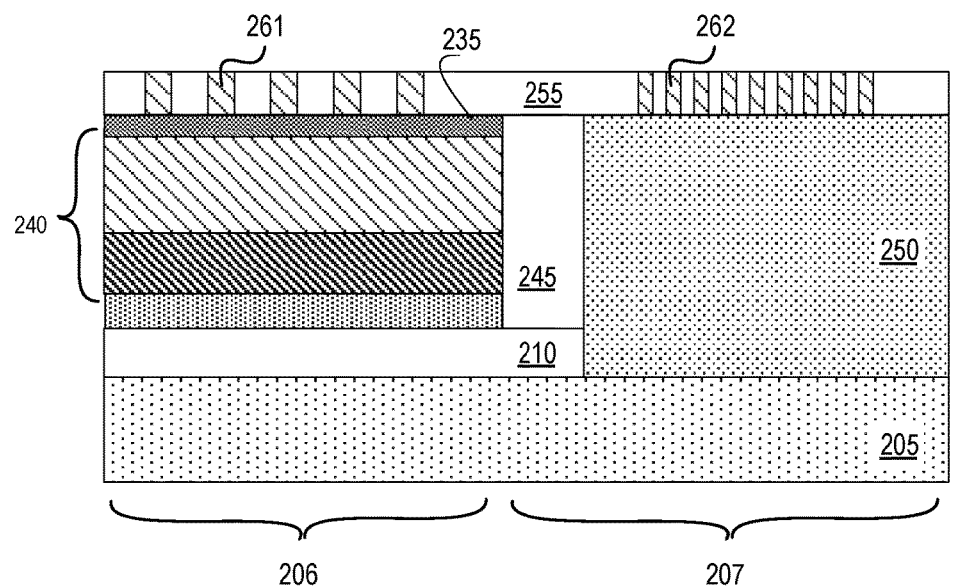
FIG. 2E is a cross-sectional view illustrating a plurality of HFET terminals disposed over the III-N semiconductor stack, and a plurality of Si FET terminals disposed over the raised silicon, formed in accordance with some embodiments of the method illustrated in FIG. 1.

FIG. 2E is a cross-sectional view illustrating a plurality of HFET terminals 261 disposed over III-N semiconductor stack 240, formed in accordance with some embodiments of operations 125. FIG. 2E also illustrates a plurality of Si FET terminals 262 disposed over raised silicon 250, formed in accordance with some embodiments of operations 130. HFET terminals 261 may be, for example, gate electrodes disposed over a polarization layer 235 with a gate dielectric (not depicted) disposed there between to modulate the 2DEG. HFET terminals 261 may also be, for example, source/drain terminals disposed over, in, or on, polarization layer 235. Likewise, FET terminals 262 may be, for example, gate electrodes disposed over raised silicon 250 with a gate dielectric (not depicted) disposed there between to modulate conduction between source/drain terminals. FET terminals 262 may also be, for example, source/drain terminals disposed over, in, or on, doped regions of raised silicon 205. Notably, either or both of the HFET and FET devices may utilize a non-planar semiconductor body architecture (not depicted) as embodiments herein are not limited in that respect.

Returning to FIG. 1, at operation 135 the Si FET (low voltage CMOS) circuitry is interconnected to III-N HFET (high voltage) circuitry. In some embodiments, metallization levels and intervening ILD is fabricated over both substrate regions, interconnecting HFETs and Si FETs concurrently. In some advantageous embodiments however, the number of metallization levels disposed over the HFETs differs from the number of metallization levels disposed over the Si FETs. Within the HFET region of a substrate there may less than half the metallization layers present in the Si FET region of the substrate. In exemplary embodiments where 9-10 metallization levels may be disposed over the Si FETs, only 1-5 metallization levels may be disposed over the HFETs. A reduced metallization level count within the HFET region of the substrate may be associated with metallization levels that have significantly greater z-thicknesses than the levels employed in the Si FET circuitry. In many applications for example, HFET device density may be much lower than that of the Si FETs. While a larger and/or lower transistor count within the HFET region of the substrate can be interconnected by fewer metallization levels, a higher interconnect power rating, and/or inductance may be beneficial to high-voltage (HV) circuitry of an integrated SOC. In one specific embodiment, where the III-N HFET circuitry comprises one or more RF power amplifier transistors, at least one thick metallization (e.g., >1.5 µm) level and/or thick ILD is disposed over the III-N HFET region. In some embodiments, HFET circuitry disposed over the HFET region of the substrate includes an inductor. The inductor may be fabricated in at least one thick metallization level with any known technique. Use of the thick metallization may enable an inductor of advantageous quality factor (Q) to be fabricated over the HFET region within the same z-thickness occupied by the more numerous, but thinner metallization levels disposed over the Si FET region.

Figure 2F:
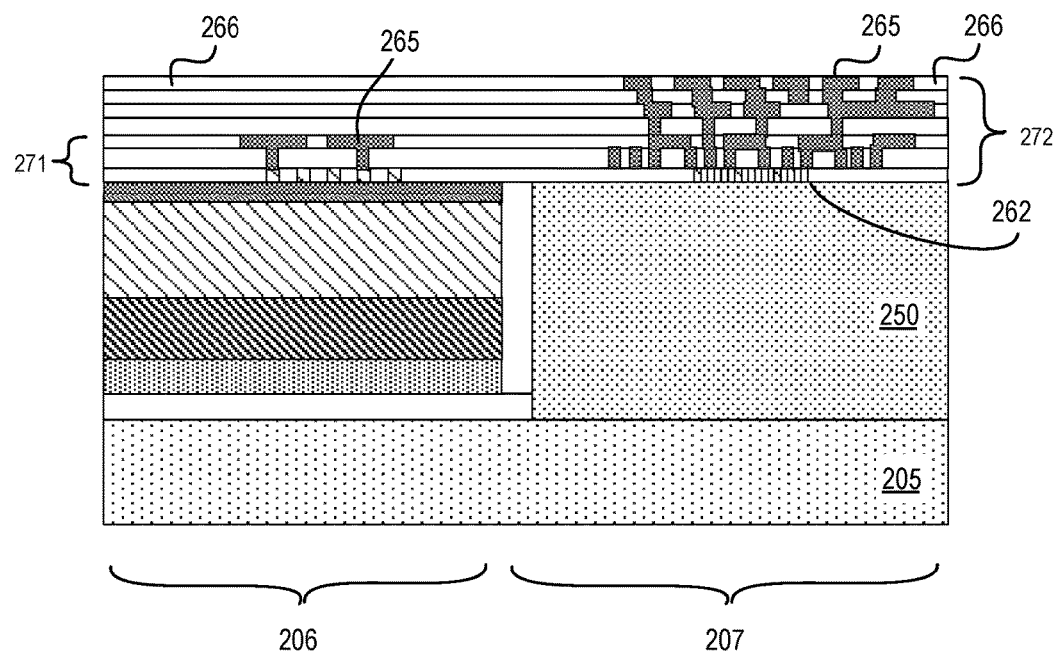
FIG. 2F is a cross-sectional view illustrating a plurality of metallization levels interconnecting Si FETs into Si FET circuitry, formed in accordance with some embodiments of the method illustrated in FIG. 1.

FIG. 2F is a cross-sectional view illustrating a plurality of metallization levels 271 interconnecting Si FET terminal 262 into Si FET circuitry, formed in accordance with some embodiments of operation 135. As illustrated, a plurality of metallization levels 265 (three illustrated) and intervening ILD 266 is formed over substrate region 207. Within substrate region 206 however, fewer metallization levels 265 are formed (e.g., metal 1 illustrated). In the exemplary embodiment, the ILD levels 266 are present in both substrate regions 206, 207. At this point, III-N HFET circuitry 271 is not interconnected with Si FET circuitry 272.

Figure 2G:
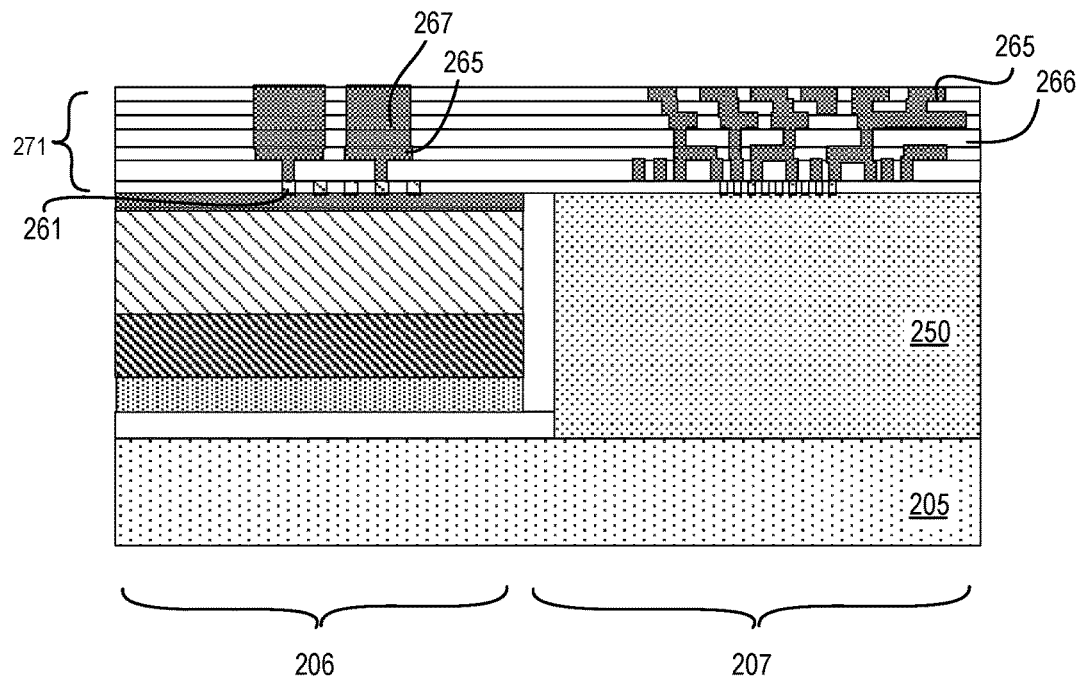
FIG. 2G is a cross-sectional view illustrating a thick metallization level within III-N HFET circuitry, formed in accordance with some embodiments of the method illustrated in FIG. 1.

In some embodiments, formation of thick metallization within III-N HFET regions of the substrate entails etching a pattern through multiple ILD levels and backfilling the etched pattern in one plating operation. In other embodiments, formation of a thick metallization level within the III-N HFET regions of the substrate entails an iterative stacking of the metallization levels employed for Si FET circuitry. FIG. 2G is a cross-sectional view illustrating a thick metallization level 267 within III-N HFETs circuitry, formed in accordance with some embodiments of operation 135. In some exemplary embodiments, thick metallization level 267 implements an inductor having a z-thickness of at least 1.5 µm and disposed only over the III-N substrate region 206. Multiple ILD levels 266 corresponding to a least two metallization levels within substrate region 207 are patterned and backfilled to form thick metallization level 267. As further illustrated, thick metallization level 267 lands on an underlying metallization level 265, further increasing the effective III-N HFET metallization level thickness by forming a metallization stack including at least one Si FET metallization level. Doubling-up Si FET metallization layers to form thicker III-N HFET metallization and/or deposition of thicker III-N HFET metallization as illustrated in FIG. 2G may be employed separately, or in combination, to differentiate the III-N HFET interconnect metallization from the Si FET interconnect metallization. As illustrated in FIG. 2G, III-N HFET circuitry 271 is not interconnected with Si FET circuitry 272, however uppermost metallization level of circuitry 271 and 272 is now planarized and can be readily interconnected with the addition of one or more metallization level extending between both substrate regions 206, 207.

Figure 2H:
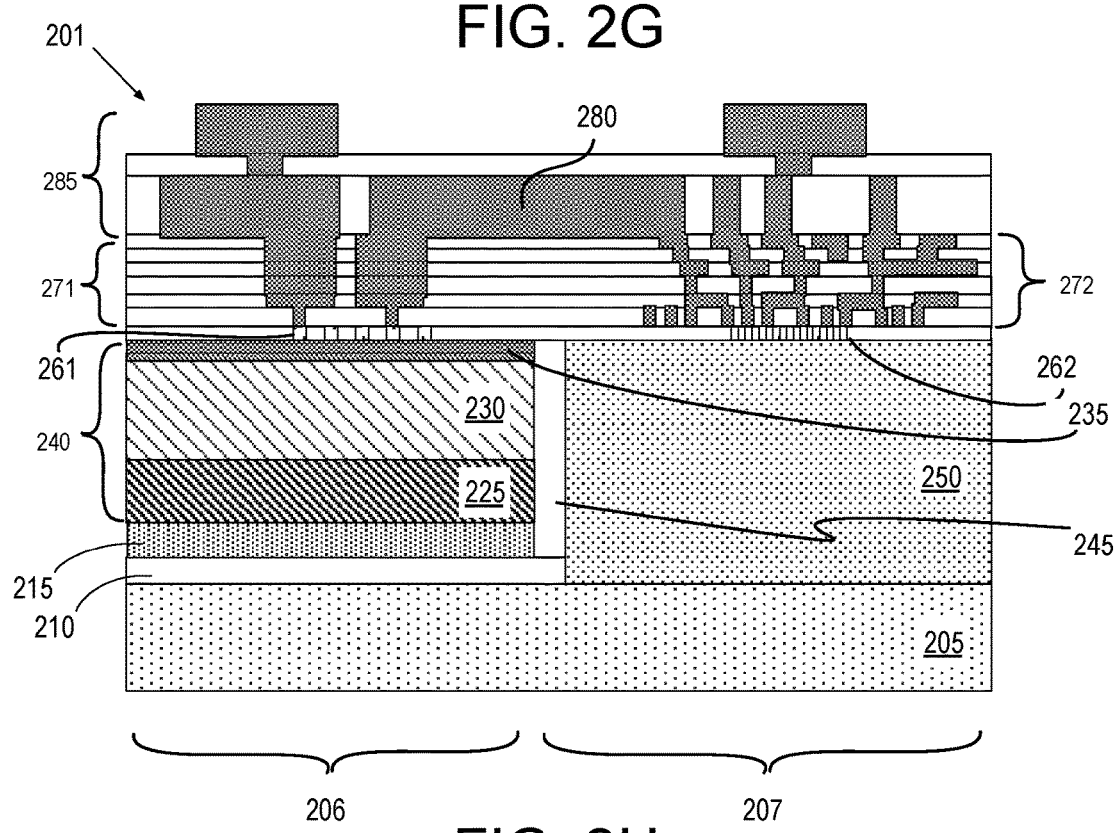
FIG. 2H is a cross-sectional view of a device with metallization levels interconnecting Si FET circuitry to III-N HFET circuitry, formed in accordance with some embodiments of the method illustrated in FIG. 1.

Method 101 (FIG. 1) is substantially complete with the output being a monolithically integrated III-N and Si device (e.g., SOC). FIG. 2H is a cross-sectional view illustrating a monolithic SOC 201 including any and/or all of the device structures and properties described above. A thick metallization level 280 interconnects III-N HFET circuitry 271 to Si FET circuitry 272, in accordance with some embodiments. As illustrated, one or more additional metallization and ILD levels 285 are disposed over both substrate region 206 and substrate region 207 to complete the integrated SOC 201. In some embodiments, SOC 201 includes III-N (GaN) HFETs within high voltage circuitry of a power management integrated circuit, while Si FETs implement logic and/or controller functions in low voltage circuitry of the PMIC. In some other embodiments, SOC 201 includes III-N (GaN) HFETs within high voltage power amplifier circuitry of an RF transceiver, while Si FETs implement logic and/or controller functions in low voltage circuitry of the RF transceiver.

Figure 3:
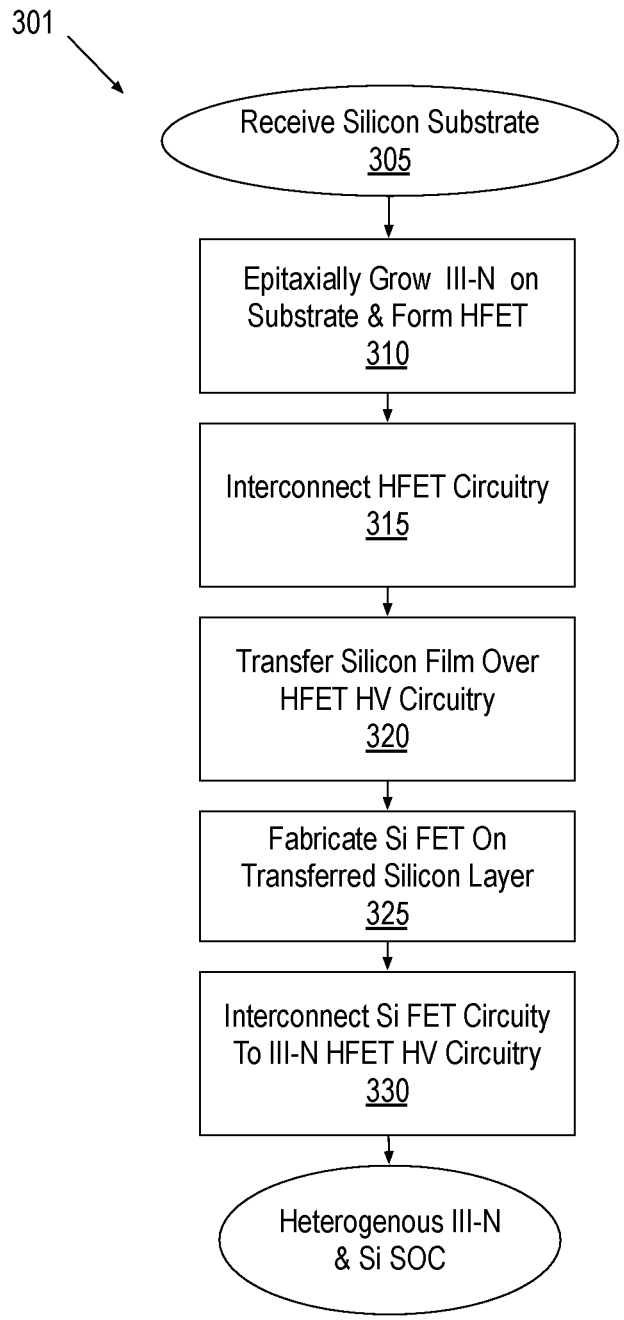
FIG. 3 is a flow diagram illustrating heterogeneous integration of III-N HFET circuitry and Si FET circuitry, in accordance with some embodiments.

FIG. 3 is a flow diagram illustrating heterogeneous integration of III-N HFET circuitry and Si FET circuitry, in accordance with some embodiments. Heterogeneous integration employs a thin film transfer process to stack a silicon layer suitable for Si FET circuitry over III-N HFET circuitry. Because two substrates are involved in fabrication of the integrated device, the resulting device is referred to herein as heterogeneous rather than monolithic. Although described in the context of advantageous HFET embodiments, it will be appreciated that similar integration may be performed for other III-N based transistor architectures (e.g., any HEMT).

Figure 4A:
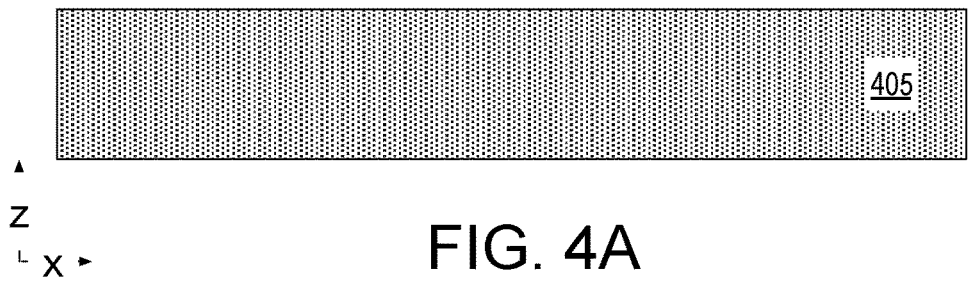
FIG. 4A is a cross-sectional view illustrating a substrate suitable for integration of III-N HFET circuitry and Si FET circuitry, formed in accordance with some embodiments of the method illustrated in FIG. 3.

Method 301 begins with receiving a substrate at operation 305 that is suitable for fabrication of III-N HFETs. In exemplary embodiments, the substrate received at operation 305 is (mono)crystalline silicon. In some advantageous embodiments, the silicon substrate is (111) silicon. FIG. 4A is a cross-sectional view illustrating a (111) silicon substrate layer 405 suitable for integration of III-N HFET circuitry and Si FET circuitry, in accordance with some embodiments of operation 305. Although illustrated as an exemplary bulk substrate, an alternative is an SOI substrate with (111) silicon substrate layer 405 being separated from an underlying substrate layer (not depicted) by a dielectric layer (not depicted).

Figure 4B:
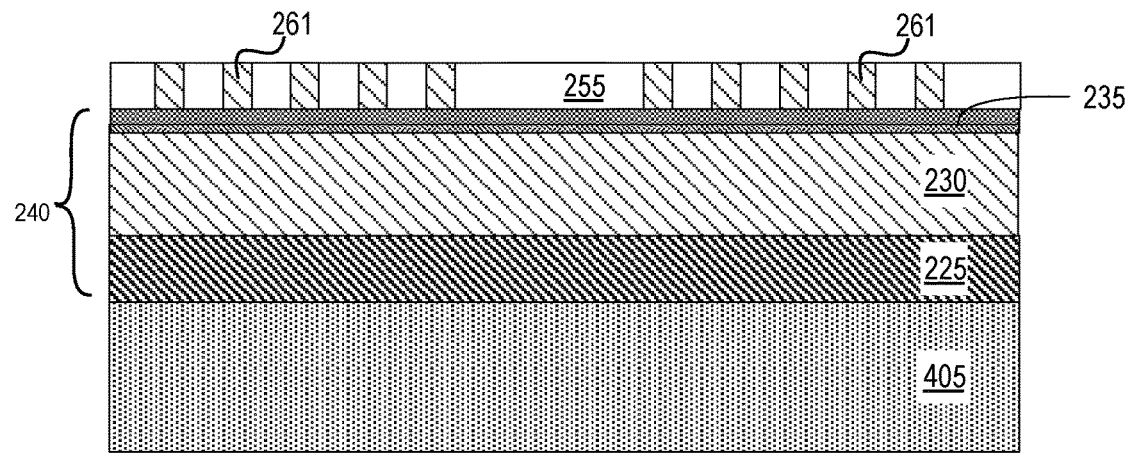
FIG. 4B is a cross-sectional view illustrating a plurality of HFET terminals disposed over a III-N semiconductor stack disposed over a substrate, formed in accordance with some embodiments of the method illustrated in FIG. 3.

Returning to FIG. 3, method 301 continues at operation 310 where a III-N material is grown over the substrate surface, and HFETs are fabricated over or on the III-N material. In some embodiments, a continuous blanket of III-N material is epitaxially grown over an entire surface area of the substrate. In other embodiments, islands of III-N material are epitaxially grown over the entire surface area of the substrate. FIG. 4B is a cross-sectional view illustrating a plurality of HFET terminals 261 disposed in an ILD 255 and over III-N semiconductor stack 240, in accordance with some embodiments.

Any known III-N heteroepitaxial growth process may be employed at operation 310 to form III-N semiconductor stack 240 over a crystalline seeding surface of silicon substrate layer 405. In exemplary embodiments, III-N semiconductor stack 240 is substantially monocrystalline having the hexagonal/wurzite c-axis substantially orthogonal to the (111) plane of silicon substrate layer 405. In other words, the c-plane of the III-N material is no more than 10° from parallel to the (111) plane of silicon substrate layer 405. In some exemplary embodiments, buffer layer 225 is grown directly on exposed regions of silicon substrate layer 405. While any known buffer structure may be employed, examples include a AlN and/or AlGaN layer. Following buffer layer growth, a GaN layer 230 is epitaxially grown using any known technique, growth temperature, pressure, and V/III ratio. Alloy species (e.g., Al) may be incorporated into GaN layer 230. GaN layer 230 may be grown to a z-thickness of 1-4 µm, or more. Following GaN layer growth, a polarization layer 235 is grown, again using any known technique. Because it is disposed on the c-plane (0001) surface of GaN layer 230, polarization layer 235 induces a 2DEG of high charge density and mobility within GaN layer 230 proximate to the interface of polarization layer 235. In some exemplary embodiments, polarization layer 235 includes at least one of an AlGaN and/or AlN and/or AlInN layer. Polarization layer 235 may have a z-thickness of 3-30 nm thick, for example.

In some embodiments, the III-N heteroepitaxial growth process at operation 310 entails growing III-N heteroepitaxial crystal islands over template openings patterned in an amorphous growth mask (not depicted) disposed over silicon substrate layer 405. For such embodiments, after patterning trenches or windows in the growth mask to expose regions of silicon substrate layer 405, the III-N heteroepitaxial growth process may rely on first epitaxial growth conditions (e.g., a first III-N growth pressure, a first III-N growth temperature, and a first V/III growth precursor ratio), and may further include multiple growth conditions if a nucleation layer is first grown upon interfacial layer. When the template structure is substantially backfilled (i.e., a trench layer planarized), growth conditions may be changed to favor lateral growth of the III-N material over the growth mask material. The amount of lateral overgrowth can be tuned by growth process conditions to achieve a desired ratio of lateral growth rate:vertical growth rate (e.g., 1.5-2.0) to ensure III-N semiconductor stack coalesces into a continuous crystal of sufficient lateral dimensions to support a population of HFETs.

In HFET embodiments, each transistor includes one or more heterojunction, for example between a polarization layer and underlying III-N material forming a 2DEG. Each transistor further includes one or more device terminal coupled to the one or more heterojunction or 2DEG. In some exemplary HFET embodiments, a gate electrode along with a pair of source/drain terminals on opposite sides of gate electrode are operable as a first transistor based on electric field modulation of the 2DEG. HFET terminals 261 may be, for example, gate electrodes disposed over polarization layer 235 with a gate dielectric (not depicted) disposed there between to enable field modulation of the 2DEG. HFET terminals 261 may also be, for example, source/drain terminals disposed over, in, or on, the polarization layer 235.

Returning to FIG. 3, at operation 315 HFETs are interconnected into (high voltage) HFET circuitry. In some advantageous embodiments, the number of metallization levels disposed over the HFETs is limited, for example only 1-5 metallization levels. A reduced metallization level may be associated with metallization levels that have significantly greater z-thicknesses than the levels typically employed in Si FET circuitry. In many applications for example, HFET device density may be much lower than that of advanced Si CMOS. While a larger and/or lower HFET transistor count can be interconnected by fewer metallization levels, a higher interconnect power rating, and/or inductance may be beneficial to HV circuitry of an integrated SOC. In one specific embodiment, where the III-N HFET circuitry comprises one or more RF power amplifier transistors, at least one thick metallization (e.g., >1.5 µm) level and/or thick ILD is disposed over the III-N HFETs. In some embodiments, HFET circuitry disposed over the HFETs includes an inductor. The inductor may be fabricated in at least one thick metallization level with any known technique. Use of the thick metallization may enable an inductor of advantageous quality factor (Q).

Figure 4C:
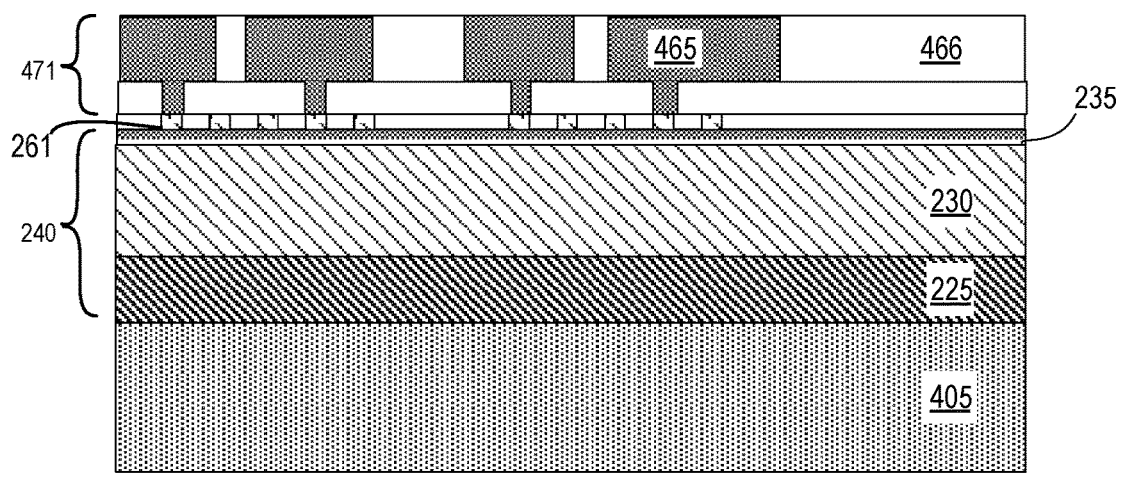
FIG. 4C is a cross-sectional view illustrating a plurality of metallization levels interconnecting a plurality of HFETs into HFET circuitry, formed in accordance with some embodiments of the method illustrated in FIG. 3.

FIG. 4C is a cross-sectional view illustrating a plurality of metallization levels interconnecting a plurality of HFETs into HFET circuitry 471, formed in accordance with some embodiments of operation 315. As illustrated, HFET circuitry 471 includes a thick metallization level 465. In one exemplary embodiment thick metallization level 465 implements an inductor having a z-thickness of at least 1.5 µm. In this illustrative embodiment, HFET circuitry 271 includes only two metallization levels.

Figure 4D:
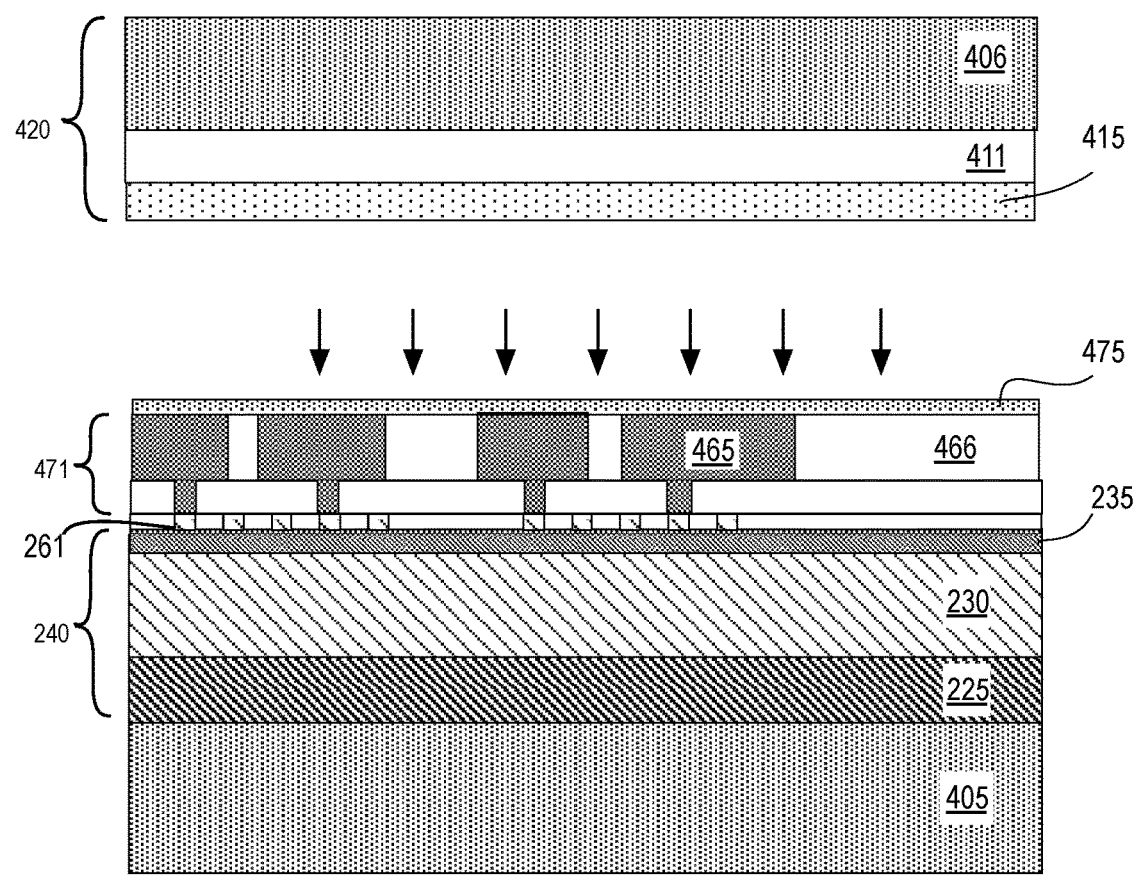
FIG. 4D is a cross-sectional view illustrating transfer of a silicon layer over the HFET circuitry, formed in accordance with some embodiments of the method illustrated in FIG. 3.

Returning to method 301 (FIG. 3), at operation 320 a crystalline silicon thin film is transferred from a donor substrate to a host substrate including HFET circuitry. Any wafer-level thin film transfer and bonding technique may be employed at operation 320 to transfer a crystalline silicon layer suitable for fabrication of Si FETs. FIG. 4D is a cross-sectional view illustrating transfer of a (100) silicon substrate layer 415 over the HFET circuitry, in accordance with some embodiments of operation 320. As illustrated in FIG. 4D, an SOI donor substrate 420 includes (100) silicon substrate layer 415 disposed over a handling substrate 406 with a dielectric layer 411 disposed there between. Silicon substrate layer 415 may be bonded with any conventional bonding material layer 475 (e.g., silicon dioxide, etc.), and separated from dielectric layer 411 and/or handling substrate 406.

Figure 4E:
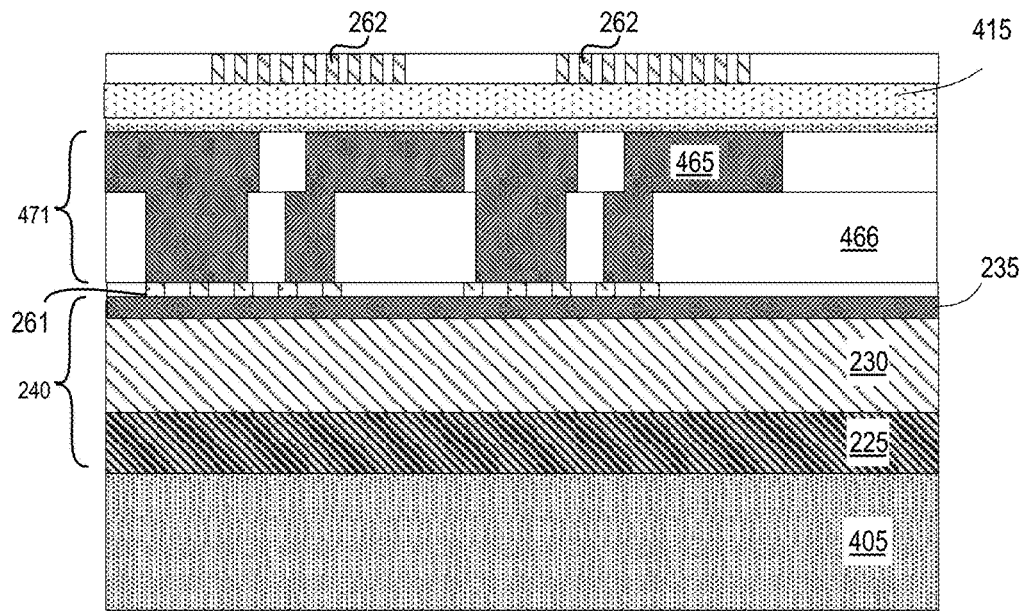
FIG. 4E is a cross-section view illustrating a plurality of Si FETs disposed over the transferred silicon layer, formed in accordance with some embodiments of the method illustrated in FIG. 3.

With a (100) silicon layer now integrated with the HFET circuitry, method 301 (FIG. 3) continues at operation 325 where Si-based transistors are fabricated on the (100) silicon layer. Operation 325 may entail any known technique to fabricate silicon-based transistors. In some exemplary FET embodiments, a gate electrode along with a pair of source/drain terminals on opposite sides of the gate electrode are operable as a transistor based on field modulation of channel conductivity. FIG. 4E is a cross-section view illustrating a plurality of FET terminals 262 disposed over the transferred (100) silicon layer 415, as formed in accordance with some embodiments of operation 325. FET terminals 262 may be, for example, gate electrodes disposed over (100) silicon layer 405 with a gate dielectric (not depicted) disposed there between to enable field modulation of a conduction path between source/drain terminals. FET terminals 262 may also be, for example, source/drain terminals disposed over, in, or on, doped regions of silicon layer 405. Si FETs may have either planar or non-planar (e.g., finFET) architecture.

Figure 4F:
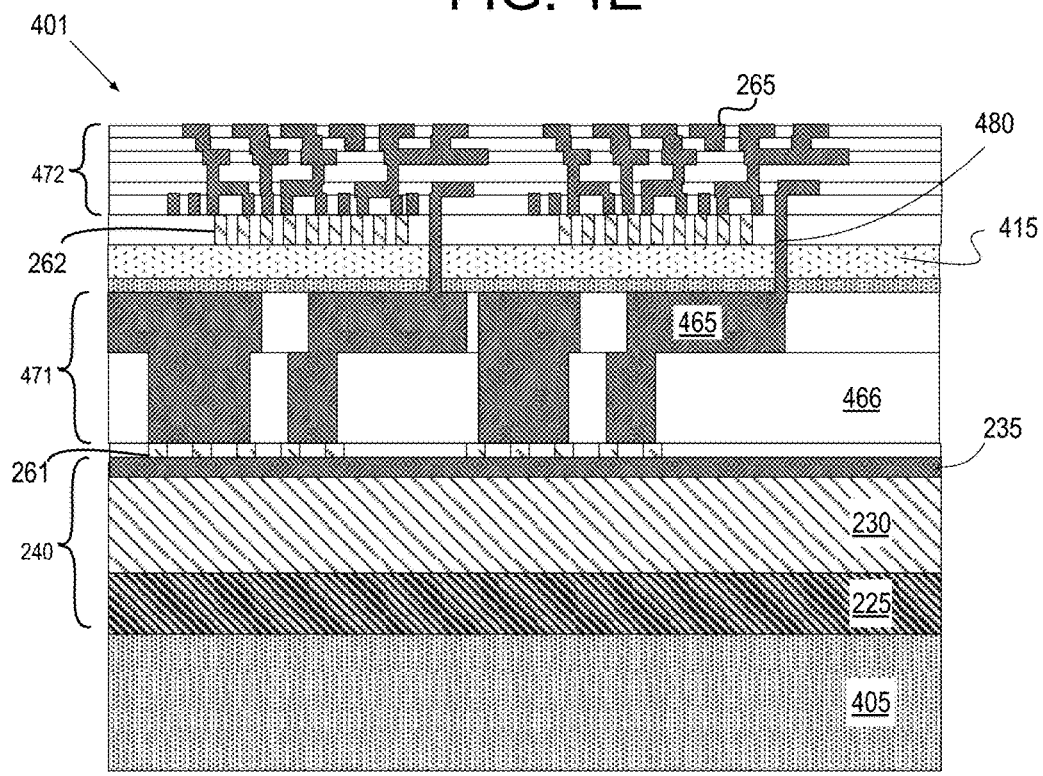
FIG. 4F is a cross-sectional view illustrating a device including a plurality of metallization levels interconnecting the plurality of Si FETs into Si FET circuitry, and interconnecting the Si FET circuitry with III-N HFET circuitry, formed in accordance with some embodiments of the method illustrated in FIG. 3.

Returning to FIG. 3, at operation 325 Si FETs are interconnected into FET circuitry, which is further interconnect with the underlying III-N HFET circuitry. Vertical interconnection between the Si FET circuitry and III-N HFET circuitry may be with any through silicon via (TSV) process as the z-thickness of the intervening (100) silicon layer may be only 50 nm-2 µm, for example. After forming interconnect metallization, method 301 is substantially complete, with an output being a heterogeneously integrated III-N and Si device (SOC). FIG. 4F is a cross-sectional view of a heterogeneously integrated III-N and Si device (SOC) 401 including any and/or all of the features and properties described above in the context of method 301 and FIG. 4A-4E.

SOC 401 includes a plurality of metallization levels 265 interconnecting the plurality of Si FETs into Si FET circuitry 472, in accordance with some embodiments. At least one metal-filled TSV 480 extends through (100) silicon layer 415 to interconnect Si FET circuitry 472 with III-N HFET circuitry 471. In some embodiments, SOC 401 includes III-N (GaN) HFETs within high voltage circuitry of a PMIC, while Si FETs implement logic and/or controller functions in low voltage circuitry of the PMIC. In some other embodiments, SOC 401 includes III-N (GaN) HFETs within high voltage power amplifier circuitry of an RF transceiver, while Si FETs implement logic and/or controller functions in low voltage circuitry of the RF transceiver.

Figure 5:
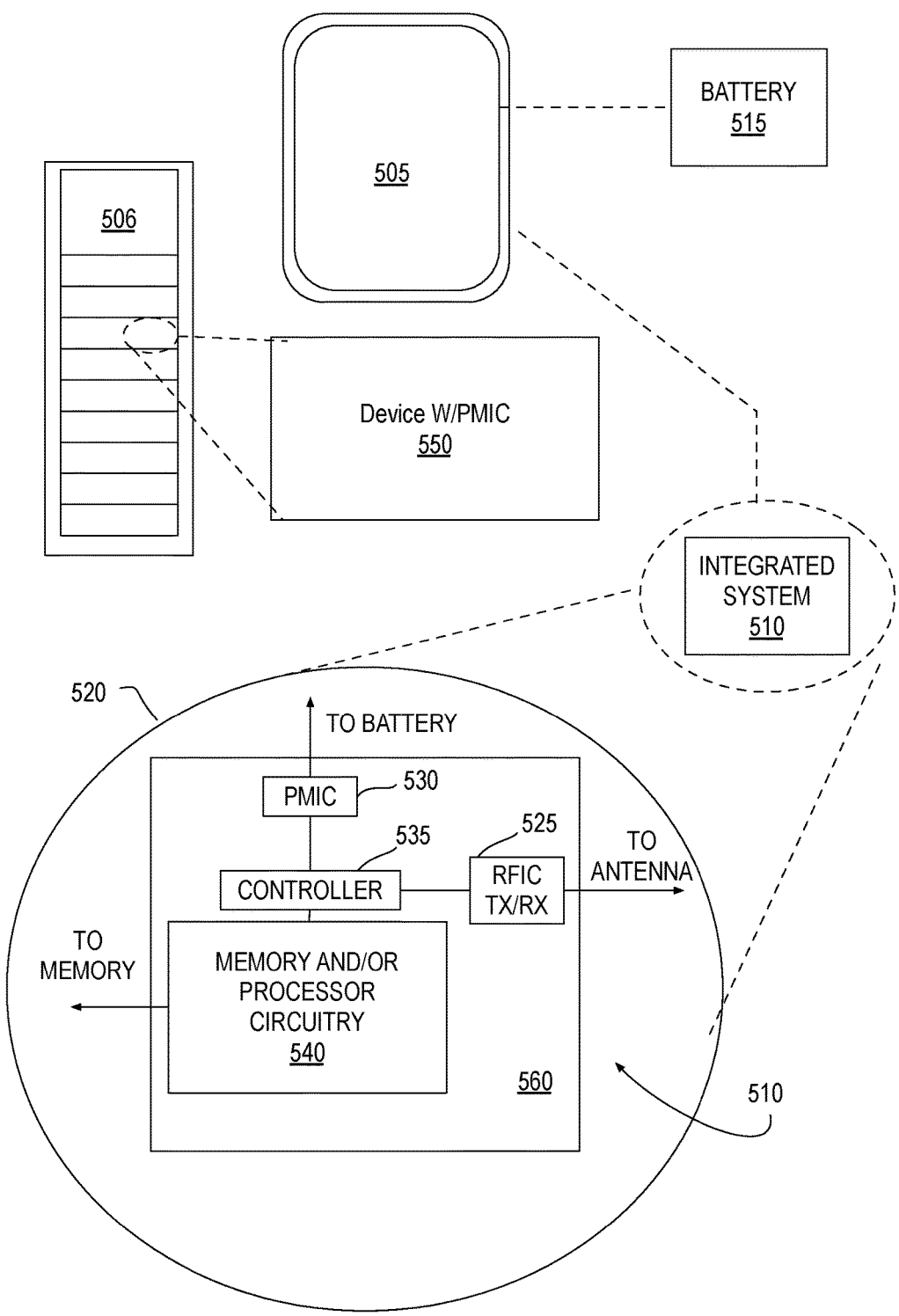
FIG. 5 is a schematic illustrating a mobile computing platform and a data server machine employing an SoC integrating III-N HFET circuitry and Si CMOS circuitry, in accordance with embodiments of the present invention.

FIG. 5 illustrates a system 500 in which a mobile computing platform 505 and/or a data server machine 506 employs a monolithically or heterogeneously integrated SOC including both III-N HFET PMIC circuitry and Si FET PMIC circuitry, for example in accordance with embodiments of the present invention described above. The server machine 506 may be any commercial server, for example including any number of high-performance computing platforms disposed within a rack and networked together for electronic data processing, which in the exemplary embodiment includes a packaged device 550.

The mobile computing platform 505 may be any portable device configured for each of electronic data display, electronic data processing, wireless electronic data transmission, or the like. For example, the mobile computing platform 505 may be any of a tablet, a smart phone, laptop computer, etc., and may include a display screen (e.g., a capacitive, inductive, resistive, or optical touchscreen), a chip-level or package-level integrated system 510, and a battery 515.

Whether disposed within the integrated system 510 illustrated in the expanded view 520, or as a stand-alone packaged device within the server machine 506, SOC 560 includes at least III-N HFET circuitry and Si-based FET circuitry. SOC 560 may further include a memory circuitry and/or a processor circuitry 540 (e.g., RAM, a microprocessor, a multi-core microprocessor, graphics processor, etc.). HFET and Si FET circuitry may implement high and low voltage portions, respectively, of one or more of PMIC 530, or RF (radio frequency) integrated circuitry (RFIC) 525 including a wideband RF transmitter and/or receiver (TX/RX). In some embodiments for example, SoC 560 includes a digital baseband and an analog front end module further comprising a power amplifier on a transmit path and a low noise amplifier on a receive path), and a controller 535.

Functionally, PMIC 530 may perform battery power regulation, DC-to-DC conversion, etc., and so has an input coupled to battery 515, and an output providing a current supply to other functional modules. As further illustrated, in the exemplary embodiment, RFIC 525 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these SoC modules may be integrated onto separate ICs coupled to a package substrate, interposer, or board.

Figure 6:
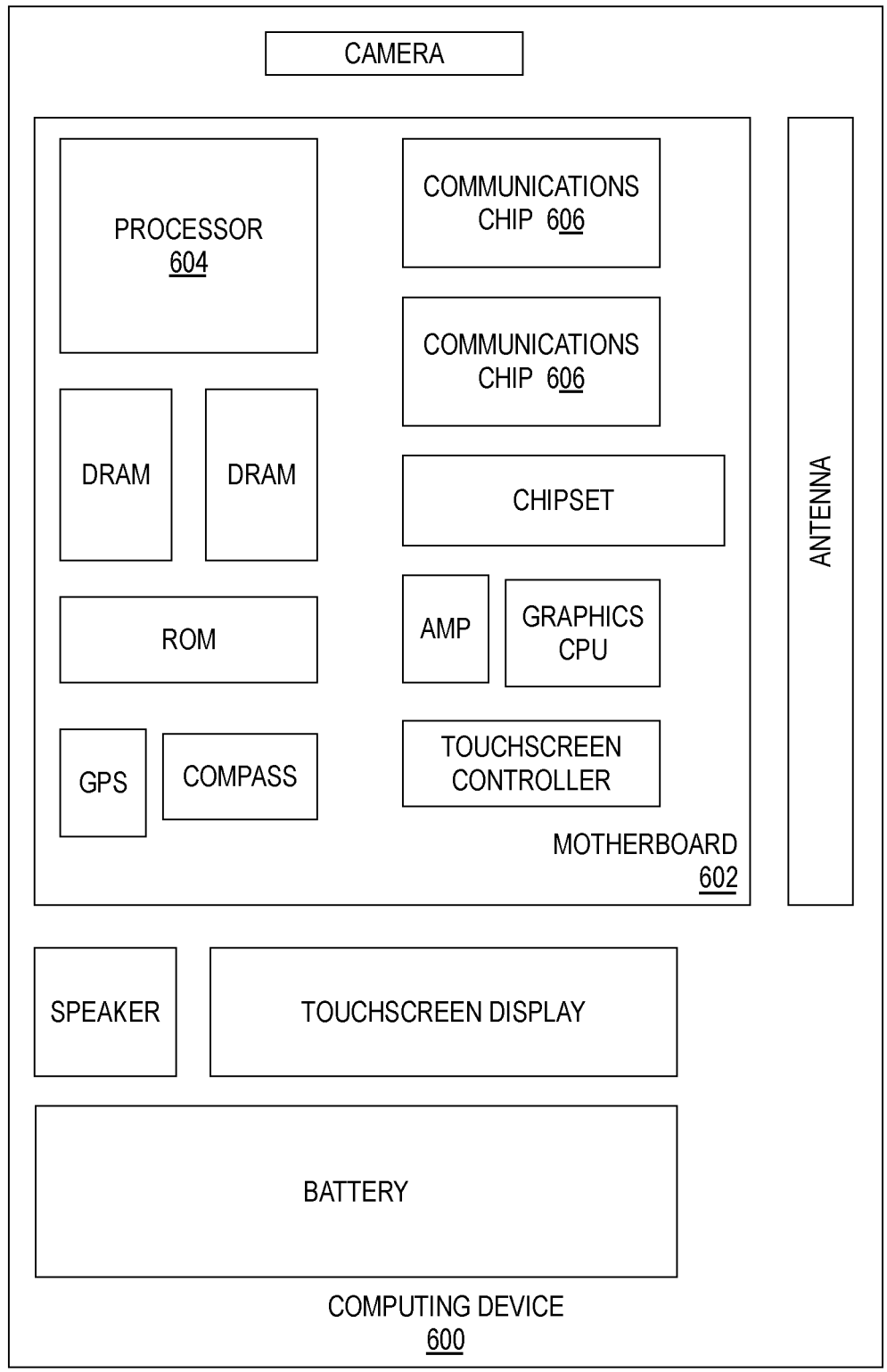
FIG. 6 is a functional block diagram illustrating an electronic computing device, in accordance with an embodiment of the present invention.

FIG. 6 is a functional block diagram of a computing device 600, arranged in accordance with at least some implementations of the present disclosure. Computing device 600 may be found inside platform 505 or server machine 506, for example. Device 600 further includes a motherboard 602 hosting a number of components, such as, but not limited to, a processor 604 (e.g., an applications processor), which may further incorporate III-N HFET circuitry interconnected with Si FET circuitry, in accordance with embodiments of the present invention. Processor 604 may for example include power management integrated circuitry (PMIC) that includes III-N HFET circuitry interconnected with Si FET circuitry. Processor 604 may be physically and/or electrically coupled to motherboard 602. In some examples, processor 604 includes an integrated circuit die packaged within the processor 604. In general, the term "processor" or "microprocessor" may refer to any device or portion of a device that processes electronic data from registers and/or memory to transform that electronic data into other electronic data that may be further stored in registers and/or memory.

In various examples, one or more communication chips 606 may also be physically and/or electrically coupled to the motherboard 602. In further implementations, communication chips 606 may be part of processor 604. Depending on its applications, computing device 600 may include other components that may or may not be physically and electrically coupled to motherboard 602. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 606 may enable wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 606 may implement any of a number of wireless standards or protocols, including but not limited to those described elsewhere herein. As discussed, computing device 600 may include a plurality of communication chips 606. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below:

In one or more first embodiments, a device includes a first of III-N transistor circuitry and Si transistor circuitry disposed over a first crystalline silicon layer of a substrate within a first region of the substrate, the first silicon layer having a first crystallographic orientation. The device further includes a second of the III-N transistor circuitry and Si transistor circuitry disposed over a second crystalline silicon layer within a second region of the substrate the second silicon layer having a second crystallographic orientation, and one or more metallization levels coupling the III-N transistor circuitry to the Si transistor circuitry.

In furtherance of the first embodiments, the first crystalline silicon layer comprises a (111) silicon layer and the III-N transistor circuitry comprises III-N heterostructure field effect transistor (HFET) circuitry disposed over the first region of the substrate. The second silicon layer comprises a (100) silicon layer separated from the (111) silicon by a dielectric layer within the first region of the substrate.

In furtherance of the embodiment immediately above, the dielectric layer is a buried silicon dioxide layer, the III-N HFET circuitry comprises a plurality of HFETs separated from the (111) silicon layer by a III-N semiconductor stack. The Si transistor circuitry comprises a plurality of FETs disposed on a surface of raised (100) silicon disposed over the (100) silicon layer. An isolation dielectric surrounds the first region of the substrate, laterally separating the III-N semiconductor stack from the raised (100) silicon.

In furtherance of the embodiment immediately above, the III-N semiconductor stack comprises a polarization layer disposed over at least a (0001) surface of a III-N semiconductor layer, the polarization layer having a composition that induces a 2D electron gas in a channel region of the III-N semiconductor layer, and a surface of the III-N semiconductor stack is substantially planar with a surface of the isolation dielectric and the surface of the raised (100) silicon.

In furtherance of first embodiments above, the isolation dielectric is disposed on the (100) silicon substrate and has a z-thickness from a surface of the (100) silicon that is at least equal to the z-thickness of the (111) silicon layer added to that of the III-N semiconductor stack.

In furtherance of first embodiments above, the one or more metallization levels include a first metallization level disposed over first gate electrodes and first source/drain terminals within the first substrate region, a plurality of second metallization levels disposed over second gate electrodes and second source/drain terminals within the second substrate region, and a third metallization level disposed over both the first metallization level and the second metallization levels, the third metallization level interconnecting the first metallization level with at least an uppermost one of the second metallization levels.

In furtherance of the first embodiments, the dielectric layer is a buried silicon dioxide layer having a thickness of 50-1000 nm. The (111) silicon layer is p-type impurity doped and has a thickness of between 25 nm and 500 nm. The III-N semiconductor stack has a z-thickness of 1-3 µm.

In one or more second embodiments, a device includes III-N transistor circuitry disposed over a silicon substrate, the III-N transistor circuitry further comprising a plurality of III-N transistors disposed on a device layer of a III-N semiconductor stack. The device includes one or more first metallization levels interconnecting the III-N transistors. The device further includes Si transistor circuitry on a silicon layer disposed over the one or more first metallization levels, the Si transistor circuitry further comprising a plurality of Si field effect transistors (FETs), and one or more second metallization levels interconnecting the Si FETs with the III-N transistor circuitry.

In furtherance of the second embodiment, the III-N semiconductor stack further comprises a GaN layer disposed over a (111) surface of the substrate, the plurality of III-N transistors comprise heterojunction field effect transistors (HFETs) further comprising a plurality of gate electrodes disposed over a (0001) surface of the III-N semiconductor stack. The silicon layer further comprises a (100) layer having a thickness less than 2 µm.

In furtherance of the embodiment immediately above, the III-N semiconductor stack further comprises a polarization layer disposed on a (0001) surface of GaN layer, the polarization layer having a composition that induces a 2D electron gas in a first channel region of the GaN layer.

In furtherance of the first embodiment, the one or more second metallization levels further comprise a metal-filled via landing on at least one of the first metallization levels, the metal-filled via extending through the silicon layer.

In furtherance of the first or second embodiments, the HFET circuitry comprises an RF power amplifier or voltage regulator, and the Si FET circuitry comprises a controller of the RF power amplifier or voltage regulator.

In one or more third embodiments, a method of integrating III-N transistor circuitry with Si transistor circuitry includes epitaxially growing a III-N semiconductor stack over a (111) silicon layer within a first region of a substrate, epitaxially growing raised (100) silicon from a (100) silicon substrate layer within a second region of the substrate, forming a plurality of III-N transistors within the first substrate region, and forming a plurality of Si transistors within the second substrate region, interconnecting the III-N transistors into the III-N transistor circuitry, interconnecting the Si transistors into the Si transistor circuitry, and interconnecting the Si transistor circuitry with the III-N transistor circuitry.

In the embodiment immediately above, epitaxially growing the III-N semiconductor stack further comprises growing the III-N semiconductor stack over a silicon-on-insulator (SOI) substrate, the SOI substrate comprising the (111) silicon layer disposed over the (100) silicon substrate with an dielectric layer there between. The method further comprises removing the (111) silicon layer within the second region of the substrate, exposing a (100) silicon substrate.

In furtherance of the embodiment immediately above, the method further comprises forming an isolation dielectric around the first region of the substrate, and planarizing a top surface of the isolation dielectric with a top surface of the III-N semiconductor stack and a top surface of the raised (100) silicon.

In furtherance of the embodiment immediately above, growing the III-N semiconductor stack further comprises growing a polarization layer from at least a (0001) surface of a III-N semiconductor layer, the polarization layer having a composition that induces a 2D electron gas (2DEG) in a first channel region of the III-N semiconductor layer, and forming the plurality of transistors further comprises forming first gate electrodes and first source/drain terminals over the polarization layer.

In furtherance of the embodiment immediately above, forming the plurality of Si transistors further comprises forming second gate electrodes and second source/drain terminals over the raised (100) silicon concurrently with forming the first gate electrodes and first source/drain terminals over the polarization layer.

In furtherance of the third embodiments, interconnecting the Si transistor circuitry with the III-N transistor circuitry further comprises forming a first metallization level over the first gate electrodes and first source/drain terminals within the first substrate region, forming a plurality of second metallization levels over the second gate electrodes and second source/drain terminals within the second substrate region, planarizing an uppermost one of the second metallization levels with the first metallization level, and interconnecting the first metallization level with at least the uppermost one of the second metallization levels.

In one or more fourth embodiment, a method of integrating III-N transistor circuitry with Si transistor circuitry includes epitaxially growing a III-N semiconductor stack over a silicon substrate, forming a plurality of III-N transistors on a device layer of the III-N semiconductor stack, interconnecting the III-N transistors into the III-N transistor circuitry, transferring a silicon layer over the III-N transistor circuitry, forming a plurality of Si transistors on the silicon layer, interconnecting the Si transistors into the Si transistor circuitry, and interconnecting the Si circuitry with the HFET circuitry.

In furtherance of the embodiment immediately above, epitaxially growing the III-N semiconductor stack over the silicon substrate comprises growing a III-N layer over a (111) surface of the substrate, and transferring the silicon layer over the III-N transistor circuitry comprises transferring a (100) silicon layer over a (0001) surface of the III-N semiconductor stack and removing a handling wafer from the (100) crystalline layer.

In furtherance of the embodiment immediately above, epitaxially growing the III-N semiconductor stack further comprises growing a polarization layer from at least a (0001) surface of a III-N semiconductor layer, the polarization layer having a composition that induces a 2D electron gas in a first channel region of the III-N semiconductor layer, and forming a plurality of III-N transistors on a device layer further comprises forming gate electrodes source/drain terminals over the polarization layer.

In furtherance of the fourth embodiment, interconnecting the III-N transistors into III-N transistor circuitry comprises forming at least a first and second level of metallization separated by at least a first interlayer dielectric (ILD), removing the handling wafer comprises separating a thick silicon substrate from the (100) silicon layer at an insulator layer disposed there between.

In furtherance of the fourth embodiments, interconnecting the Si transistor circuitry with the III-N transistor circuitry further comprises forming at least a third metallization level over both the Si transistor circuitry and the III-N transistor circuitry.

In furtherance of the fourth embodiments, wherein forming at least the third metallization level further comprises filling a via landing on at least one of the first and second levels of metallization.

In furtherance of the embodiment immediately above, wherein forming at least the third metallization level further comprises etching the via through the silicon layer.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A device, comprising:
   III-N transistor circuitry over a first silicon layer within a first region of the a substrate, the first silicon layer having a first crystallographic orientation, wherein the III-N transistor circuitry is separated from the first silicon layer by one or more layers of III-N semiconductor material;
   Si transistor circuitry over a second silicon layer within a second region of the substrate, the second silicon layer having a second crystallographic orientation; and
   one or more metallization levels coupling the III-N transistor circuitry to the Si transistor circuitry, wherein, within the first region, the second silicon layer is separated from the first silicon layer by a dielectric layer therebetween, and within the second region the dielectric layer, the first silicon layer, and the one or more layers of III-N semiconductor material are absent.

2. The device of claim 1, wherein:
   the first silicon layer comprises a (111) silicon layer and the III-N transistor circuitry comprises III-N heterostructure field effect transistor (HFET) circuitry;
   the second silicon layer comprises a (100) silicon layer separated from the (111) silicon by a dielectric layer within the first region of the substrate.

3. The device of claim 2, wherein:
   the III-N HFET circuitry comprises a plurality of HFETs separated from the (111) silicon layer by a III-N semiconductor stack;
   the Si transistor circuitry comprises a plurality of FETs on a surface of raised (100) silicon over the (100) silicon layer; and
   an isolation dielectric surrounds the first region of the substrate, laterally separating the III-N semiconductor stack from the raised (100) silicon.

4. The device of claim 3, wherein:
   the III-N semiconductor stack comprises a polarization layer over at least a (0001) surface of a III-N semiconductor layer, the polarization layer having a composition that induces a 2D electron gas in a channel region of the III-N semiconductor layer; and
   a surface of the III-N semiconductor stack is substantially planar with a surface of the isolation dielectric and the surface of the raised (100) silicon.

5. The device of claim 3, wherein the isolation dielectric is on the (100) silicon substrate and has a z-thickness from a surface of the (100) silicon, the z-thickness being at least equal to a z-thickness of the (111) silicon layer added to that of the III-N semiconductor stack.

6. The device of claim 2, wherein:
   the dielectric layer is a buried silicon dioxide layer having a thickness of 50-1000 nm;
   the (111) silicon layer comprises p-type impurities and has a thickness of between 25 nm and 500 nm; and
   the one or more layers of III-N semiconductor material have a z-thickness of 1-3 µm.

7. The device of claim 1, wherein the one or more metallization levels include:
   a first metallization level over first gate electrodes and first source/drain terminals within the first substrate region;

a plurality of second metallization levels over second gate electrodes and second source/drain terminals within the second substrate region; and a third metallization level over both the first metallization level and the second metallization levels, the third metallization level interconnecting the first metallization level with at least an uppermost one of the second metallization levels.

8. A method of integrating III-N transistor circuitry with Si transistor circuitry, the method comprising:
   epitaxially growing a III-N semiconductor stack over a (111) silicon layer within a first region of a silicon-on-insulator (SOI) substrate, the SOI substrate comprising the (111) silicon layer over a (100) silicon substrate with a dielectric layer therebetween;
   removing the (111) silicon layer within a second region of the substrate, exposing a (100) silicon substrate;
   epitaxially growing raised (100) silicon from the (100) silicon substrate layer within the second region of the substrate;
   forming a plurality of III-N transistors within the first substrate region;
   forming a plurality of Si transistors within the second substrate region;
   interconnecting the III-N transistors into the III-N transistor circuitry;
   interconnecting the Si transistors into the Si transistor circuitry; and
   interconnecting the Si transistor circuitry with the III-N transistor circuitry.

9. The method of claim 8, further comprising:
   forming an isolation dielectric around the first region of the substrate; and
   planarizing a top surface of the isolation dielectric with a top surface of the III-N semiconductor stack and a top surface of the raised (100) silicon.

10. The method of claim 9, wherein:
    growing the III-N semiconductor stack further comprises growing a polarization layer from at least a (0001) surface of a III-N semiconductor layer, the polarization layer having a composition to induce a 2D electron gas (2DEG) in a first channel region of the III-N semiconductor layer; and
    forming the plurality of transistors further comprises forming first gate electrodes and first source/drain terminals over the polarization layer.

11. The method of claim 10, wherein forming the plurality of Si transistors further comprises forming second gate electrodes and second source/drain terminals over the raised (100) silicon concurrently with forming the first gate electrodes and first source/drain terminals over the polarization layer.

12. The method of claim 8, wherein interconnecting the Si transistor circuitry with the III-N transistor circuitry further comprises:
    forming a first metallization level over the first gate electrodes and first source/drain terminals within the first substrate region;
    forming a plurality of second metallization levels over the second gate electrodes and second source/drain terminals within the second substrate region;
    planarizing an uppermost one of the second metallization levels with the first metallization level; and
    interconnecting the first metallization level with at least the uppermost one of the second metallization levels.

13. A device, comprising:
    III-N transistor circuitry over a first silicon layer within a first region of the a substrate, the first silicon layer having a first crystallographic orientation, wherein the III-N transistor circuitry is separated from the first silicon layer by one or more layers of III-N semiconductor material;
    Si transistor circuitry over a second silicon layer within a second region of the substrate, the second silicon layer having a second crystallographic orientation; and
    one or more metallization levels coupling the III-N transistor circuitry to the Si transistor circuitry, wherein, within the second region, the second silicon layer is separated from the first silicon layer by a dielectric layer therebetween, and within the first region the dielectric layer and the second silicon layer are absent.

14. The device of claim 13, wherein:
    the first silicon layer comprises a (111) silicon layer and the III-N transistor circuitry comprises III-N heterostructure field effect transistor (HFET) circuitry;
    the second silicon layer comprises a (100) silicon layer.

15. The device of claim 14, wherein the Si transistor circuitry comprises a plurality of FETs on a surface of (100) silicon over the (111) silicon layer.

16. The device of claim 14, wherein the III-N semiconductor material comprises a polarization layer over at least a (0001) surface of a III-N semiconductor device layer, the polarization layer having a composition that induces a 2D electron gas in a channel region of the III-N semiconductor device layer.

* * * * *